United States Patent [19]
Byren et al.

[11] Patent Number: 5,654,831
[45] Date of Patent: Aug. 5, 1997

[54] REFRACTIVE ELLIPSOID OPTICAL SURFACE WITHOUT SPHERICAL ABERRATION

[75] Inventors: Robert W. Byren, Hermosa Beach; James E. Klein, Glendale, both of Calif.

[73] Assignee: Hughes Electronics, Los Angeles, Calif.

[21] Appl. No.: 368,447

[22] Filed: Jan. 4, 1995

[51] Int. Cl.$^6$ ..................................... G02B 3/02
[52] U.S. Cl. ................................. 359/718; 359/708
[58] Field of Search ......................... 359/708, 709, 359/718, 719

[56] References Cited

U.S. PATENT DOCUMENTS

| | | | |
|---|---|---|---|
| 1,422,307 | 7/1922 | Salto | 359/718 |
| 2,215,900 | 9/1940 | Bitner | 357/718 |
| 2,224,178 | 12/1940 | Bitner | 359/718 |
| 3,711,722 | 1/1973 | Kavanagh | 359/711 |
| 4,428,647 | 1/1984 | Sprague et al. | 359/20 |
| 4,609,262 | 9/1986 | Fujikawa et al. | 359/719 |
| 4,753,520 | 6/1988 | Silverglate | 359/728 |
| 4,770,514 | 9/1988 | Silverglate | 359/728 |
| 4,869,580 | 9/1989 | Silverglate | 359/718 |
| 4,904,062 | 2/1990 | Morishita et al. | 359/708 |
| 5,013,144 | 5/1991 | Silverglate et al. | 359/709 |
| 5,081,639 | 1/1992 | Snyder et al. | 359/710 |
| 5,251,060 | 10/1993 | Uenishi et al. | 359/328 |
| 5,285,318 | 2/1994 | Gleckman | 359/709 |

FOREIGN PATENT DOCUMENTS

| | | |
|---|---|---|
| 0240194 | 10/1987 | European Pat. Off. . |
| 6331888 | 12/1994 | Japan . |
| 9206521 | 4/1992 | WIPO . |

OTHER PUBLICATIONS

E. Hecht, "Optics", 1987, Second Edition, Addison–Wesley, Reading, Massachusetts, Chapter 5.2.1.

Conference on Lasers and Electro Optics (CLEO), Baltimore, May 12–17, 1991, vol. 10,12 May 1991, Institute of Electrical and Electronics Engineers, pp. 28, 30–31; Synder J. J. et al: "Cylindrical Microlenses For Collimating Laser Diodes" (entire document).

*Primary Examiner*—Georgia Y. Epps
*Assistant Examiner*—Jordan M. Schwartz
*Attorney, Agent, or Firm*—Gordon R. Lindeen, III; Michael W. Sales; Wanda K. Denson-Low

[57] ABSTRACT

According to the present invention, light is provided to an elliptical optical surface (102) separating first and second homogeneous optical media (104), (106) that cause collimated light (108) originating in one of the media to be perfectly focussed either at a primary focus within the second medium or at a virtual focus within the first medium (110). For example, a collimated beam (510) is expanded by refraction in an immersion refractive confocal ellipsoid optic (502) having an input optical surface (504) and output optical surface (506). Further, the elliptical optical surface is used in combination with a second optical surface such that both surfaces share a common optic axis and are separated by an optically transmissive medium such as glass and spaced such that the optical focal points of both surfaces are common to create an immersion optical beam expander. Still further, said optical surface (1112) includes a lens element in a one or two dimensional lens array responsive to light from a light emitting diode or laser diode bar in a diode array.

20 Claims, 7 Drawing Sheets

A. ETCHED MIRROR APPROACH

B. GRATING APPROACH

REFRACTIVE ELLIPSOID OPTICAL SURFACE WITHOUT SPHERICAL ABERRATION

TECHNICAL FIELD

The present invention is related to the focussing and collimation of light, particularly by refraction.

BACKGROUND OF THE INVENTION

Refraction or bending of light rays occurs at an optical surface separating optically transmissive media that have different indices of refraction (that is, light travels at a different speed in these media). Numerous refractive surface shapes have been used separately and in combination for focussing parallel light rays to a point or line, or equivalently, for collimating light rays emanating from a point or line source of light. These refractive surfaces are approximate optical forms in which optical performance is traded-off against (a) the cost of fabricating the surface(s), (b) the fabrication tolerances, (c) the number of surfaces used, (d) the tolerance in the location of the surfaces with respect to each other and with respect to the image or focal plane, and (e) the temperature sensitivity.

Refractive forms are particularly useful when used with laser beams. Laser radiation is monochromatic; that is, it (ideally) contains only one wavelength of light. In transmissive optical media, light of different wavelengths travel at different speeds within the medium. Chromatic aberrations occur when light of different wavelengths focus at different points. Because laser radiation is monochromatic, the dispersion of light in transmissive optical media—which is responsible for chromatic aberrations—is essentially non-existent.

The purpose of a laser beam expander is to expand the width of an incident laser beam to provide a broader laser beam and reduce the laser beam divergence, that is the angular spread of optical rays.

A conventional telescope or beam expander requires at least two lens elements and an intervening optical bench. An objective lens (or lens group) is used to focus the light rays ideally to a single point. A secondary lens (or lens group), sometimes called an eyepiece, is used to recollimate the light with some amount of magnification or demagnification which depends on the relative focal lengths of the objective and eyepiece. For most telescopes, a tubular housing serves as the optical bench.

Telescopes or laser beam expanders are of two types: reflective and refractive. All reflective telescopes or beam expanders require an optical bench to maintain alignment between two reflective optical surfaces and suffer from the problem that one of the surfaces always obscures the other when operated on-aperture with the incident beam.

In the reflective optical telescope forms used in modern astronomical telescopes the secondary mirror, which is centered on the optic axis, obscures the central part of the aperture of the primary mirror (primary aperture). The diffraction effects of the central obscuration and problems associated with suspending the secondary mirror within the primary aperture can be eliminated by offsetting the primary aperture to a region of the primary mirror that is not obscured by the secondary, with a corresponding decrease in off-axis performance. This is an off-aperture optical system. A refractive telescope has no central obscuration because the secondary lens does not block the primary; therefore, there is no need to transmit light off-aperture.

A paraboloid reflective optical surface is an exact optical form. For a paraboloid surface defined by rotating a parabolic curve about its axis of symmetry(optic axis), all rays parallel to the optic axis are focussed perfectly to a single point on the optic axis which is the mathematical focus of the paraboloid curve. Two such paraboloid surfaces of revolution can be arranged in a confocal configuration in which the optic axis of the surfaces are identical and the mathematical foci of the two parabolic shapes are coincident on the optic axis.

A similarly defined confocal paraboloid telescope or beam expander optical form is also an exact form. All rays parallel to the optic axis are focussed by the first surface and perfectly recollimated by the second surface such that the optical path length difference between these rays is precisely zero and they emerge from the second surface parallel to one another.

Numerous refractive systems have been used for magnifying images or expanding optical beams, most employing at least two air-spaced optical elements held in alignment by an optical bench.

It would be desirable to remove the disadvantages of the present reflective and refractive beam expanders and telescopes. If, further, this task could be achieved with a reduction in parts, the benefit to the art of laser beam expansion would be unparalleled.

Another issue concerning laser beams involves the problems attendant in laser diode arrays. A laser diode array consists of an array of individual diode bars, where each diode bar serves as a source of light. All of the individual diode bars together serve as an array of individual light sources. Each individual diode bar is composed of linear arrays of light emitting p-n junction diodes that are configured such that the emitting region is within one of the layers of the planar semiconductor diode structure. The edges are cleaved and coated to form an optical resonator and lasing occurs in a direction normal to these edges, hence the descriptor known in the art: "edge-emitting" diode. The active region of each laser diode is bounded by the cleaved surfaces in the longitudinal direction and by lithographically defined semiconductor structures (grooves, implanted regions, etc.) in the transverse direction. Usually hundreds of these laser diodes are included on a single substrate or "bar". The diodes are arranged side-by-side and all share the same output edge. The laser light emitted from the output edge of such an edge-emitting diode bar is reasonably well collimated in the direction corresponding to the long dimension of the array due to the constructive interference between the "in-phase" emitters (similar to a radar phase array antenna). The laser light is not well collimated in the direction corresponding to the narrow dimension, since the emitting aperture is very small and diffraction causes the light to spread considerably. For most applications, the laser light from the diode must be collimated in this direction with a cylindrical or anamorphic lens. For a laser diode pumping application, the task is to relay the light from the diode bar to a laser rod, which generally requires collimation and then focussing.

To create a two-dimensional array of laser diodes, whether conventional or monolithic, it is necessary to stack multiple edge-emitting diode bars. This makes cooling of the diode bars difficult because the diode bars are most efficiently cooled through their flat surfaces, and these surfaces are more difficult to access in a two-dimensional structure. Conventional approaches mount the individual diode bars on thin coolers which can be stacked together to form a two-dimensional (2-D) array, the so-called "rack-and-stack" configuration. Some structures used today employ a monolithic shelf configuration on which the diodes are placed and these structures cool the entire shelf through the back surface of the diode bars. The shelf approach is limited by the low thermoconduction through the shelf itself since it relies on conduction alone for the thermal transfer.

Conventional cylindrical optical lenses, available from several vendors, are now used to collimate the output of conventional "rack-and-stack" as well as shelved arrays. These lenses are mounted in close proximity to the emitting edge of the bar and are arranged with the cylindrical edge along the long dimension of the array. A perfect cylindrical lens would act to preserve beam quality of the laser in the narrow dimension; that is, the product of the beam divergence and the emitting aperture measured out of the diode would be the same as the divergence-aperture product measured at the output of the collimating lens. Practical optics can never perfectly conserve beam quality due to: a) aberrations caused by the optical prescription itself, b) the construction of the lens, c) placement of the lens with respect to the diode bar, and d) warpage of the diode bar.

The aberrations associated with a conventional refractive optic become more severe as the optic is forced to operate off-aperture from the light-emitting axis of the diode bar; additional optical elements can be retired to adequately correct the aberrations.

It is desirable to eliminate the problems of a) conventional reflective and refractive laser beam expanders, as well as the problems of (b) conventional 1 dimensional and 2 dimensional laser diode arrays.

DISCLOSURE OF THE INVENTION

Objects of the invention include providing spherical aberration-free refractive focusing and/or recollimation of light.

According to the invention, this is accomplished with an ellipsoidal surface between two optical media, the position of the foci, base radius of curvature, and eccentricity of the ellipsoidal surface having a specific mathematical relationship to the indices of refraction between the media and the optical focal length. The invention may be applied to (a) distortionless refractive expansion of a laser beam or (b) distortionless collimation of light emitted from a light emitting diode (LED) or laser diode.

According to the present invention, light provided to an elliptical optical surface separating first and second homogeneous optical media that causes collimated light rays originating in the first optical medium to be either perfectly focussed at a real focus (also referred to as a "primary focus") within the second homogeneous optical medium, or to be perfectly diverged from a virtual focus within the first homogeneous optical medium. Further in accordance with the present invention, the elliptical optical surface is used in combination with a second optical surface such that both surfaces share a common optic axis and are separated by an optically transmissive medium such as glass and spaced such that the optical focal points of both surfaces are common to create an immersion optical beam expander. Still further in accordance with the present invention, said optical surface includes a lens element in a one or two dimensional lens array responsive to light from a light emitting diode or laser diode bar in a diode array.

A first feature of the present invention is that it is an exact optical form of its reflective analog, the paraboloid, and not the product of successive approximations using high order aspheric terms to achieve an acceptable optical prescription. All rays of a given wavelength of light parallel to the optic axis that are incident on the optical surface are focussed to the same point on the optic axis; therefore, the on-axis spherical aberration of the optical surface is precisely zero.

A second feature is that the laser beam expander application of the present invention needs no optical bench.

A third feature of the present invention is that the application of the invention to a diode collimating lens exhibits excellent off-aperture performance.

The fourth feature is that the present invention is applicable to any two-dimensional laser diode array including those where the emitting axis of the diode bar is not normal to the plane of two-dimensional array.

These and other objects features and advantages will be understood more fully in light of the drawings and corresponding text.

BEST MODE FOR CARRYING OUT THE INVENTION

A. DESIGN CRITERIA FOR REFRACTIVE ELLIPSOID OPTICAL SURFACE AND OPTICAL BEAM EXPANDER

Figure 1:
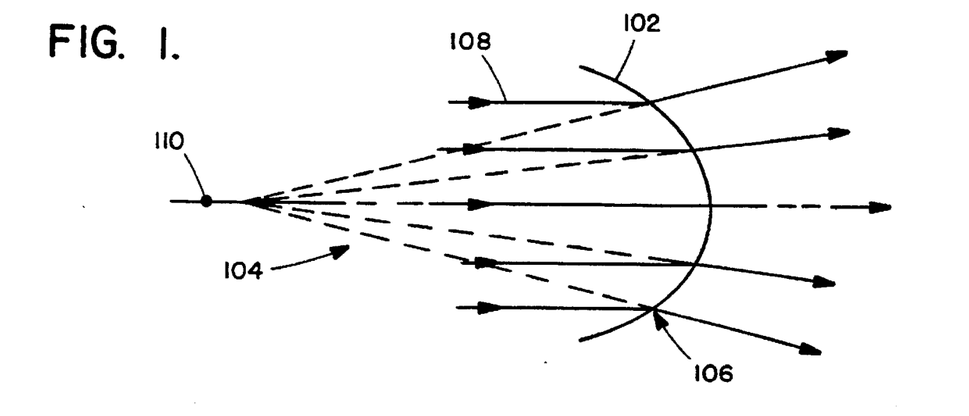
FIG. 1 is a side view of a refractive ellipsoidal optical surface with no spherical aberrations according to the present invention.
Figure 1A:
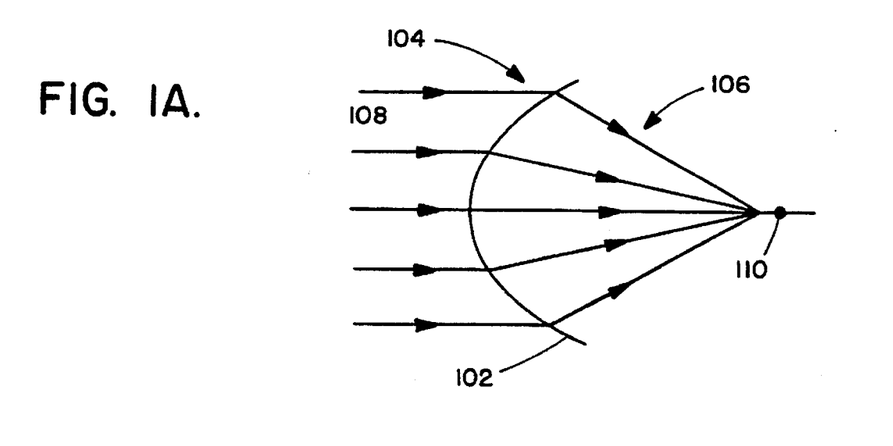
FIG. 1a shows a side view of another refractive ellipsoidal optical surface according to the present invention

The invention proposes an explicit mathematical description of the shape of an optical surface 102 that separates a first homogeneous optical medium 104 and a second homogeneous optical medium 106. The optical surface 102 causes collimated light rays 108 originating in the first homogeneous optical medium 104 to be either perfectly focussed at a real focus (also referred to as a "primary focus") 110' within the second homogeneous optical medium 106, as is shown in FIG. 1a, or to be perfectly diverged from a virtual focus 110 within the first homogeneous optical medium 104, as is shown in FIG. 1.

In one embodiment of the invention, an optical surface is an ellipsoid of rotation 102 about the semi-major axis of the ellipsoid with its center located at a distance $Z_0$ from the (virtual) focus and its base curvature (R) and conic constant (K) described as explicit functions of relative refractive index (n) and the (virtual) focal distance (F), per the design equations below.

$$Z_0 = F/(n+1) \tag{1}$$

$$K = -1/n^2 \tag{2}$$

$$R = \frac{n-1}{n} \cdot F \tag{3}$$

Figure 2:
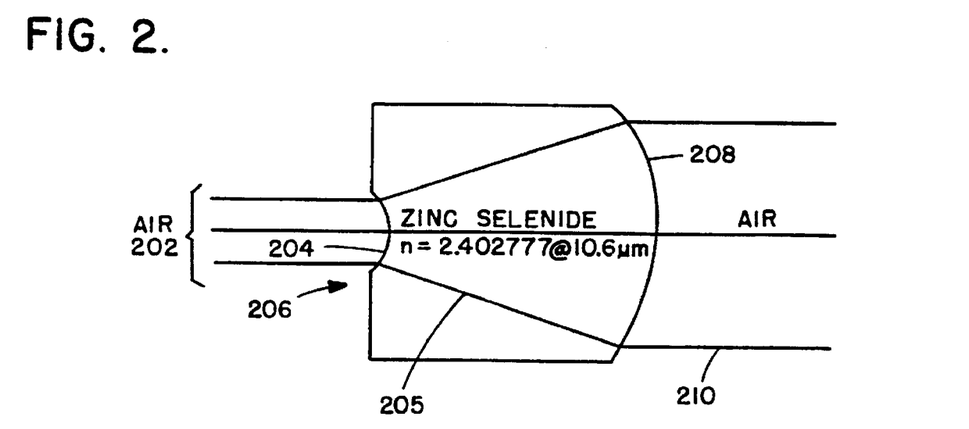
FIG. 2 is a side view of an embodiment of the immersion beam expander according to the present invention.

Two such surfaces, arranged so that the real focus of a first one of the surfaces and the virtual focus of a second one of the surfaces are located at a same point (i.e., confocal), can be used to expand a collimated optical beam, as is illustrated in FIG. 2. Equations 1, 2 and 3 above can be formulated in terms of design parameters of the beam expander of FIG. 2. Equation 4, below, defines a base radius of curvature of an input optical surface ($R_1$) in terms of a magnification (M), a relative refractive index (n) for the optical surface $R_1$, and the axial thickness of the optic (th). Equation 5 defines a base radius of curvature of the output surface ($R_2$) in terms of the base radius of the input surface $R_1$ and the magnification M of the beam expander, which is simply the ratio of output to input beam diameters. The conic constant (K) for both surfaces is the same and is given by equation 2 above. The maximum diameter of the input beam that can be accommodated by the beam expander is theoretically limited to the length of the minor axis of the ellipsoid (discussed below), however a practical limit will be governed by manufacturing constraints and fresnel losses at the high angles of incidence.

$$R_1 = \frac{1}{M-1} \cdot \frac{n-1}{n} \cdot th \tag{4}$$

$$R_2 = M \cdot R_1 \tag{5}$$

FIG. 2 illustrates an optical beam expander designed in consideration of equations (1)–(5). Optical beams 202 in a first medium—for example, air—are incident upon a first surface 204 of an optical medium 206. An expanded version 210 of the incident optical beams 202 is provided from a second optical surface 208. The ZnSe optical medium 206 of FIG. 2 has a refractive index of 2.402777 at an optical wavelength of 10.6 micrometers (wavelength of a $CO_2$ laser).

The design values are listed:
Magnification=3.73529
Input Beam Diameter=6.8 mm
Output Beam Diameter=25.4 mm
$R_1$=6.40313 mm
$R_2$=23.91757 mm
$K_1=K_2=-0.17321$ Note that the optic surface 206 is an immersion beam expander because the two optical surfaces 206, 208 have no medium (such as air) between them. Accordingly, the present invention provides an improvement over the prior art in providing a refractive optical beam expander with no optical bench to hold two separate lenses.

B. DERIVATION OF DESIGN EQUATIONS

Figure 3:
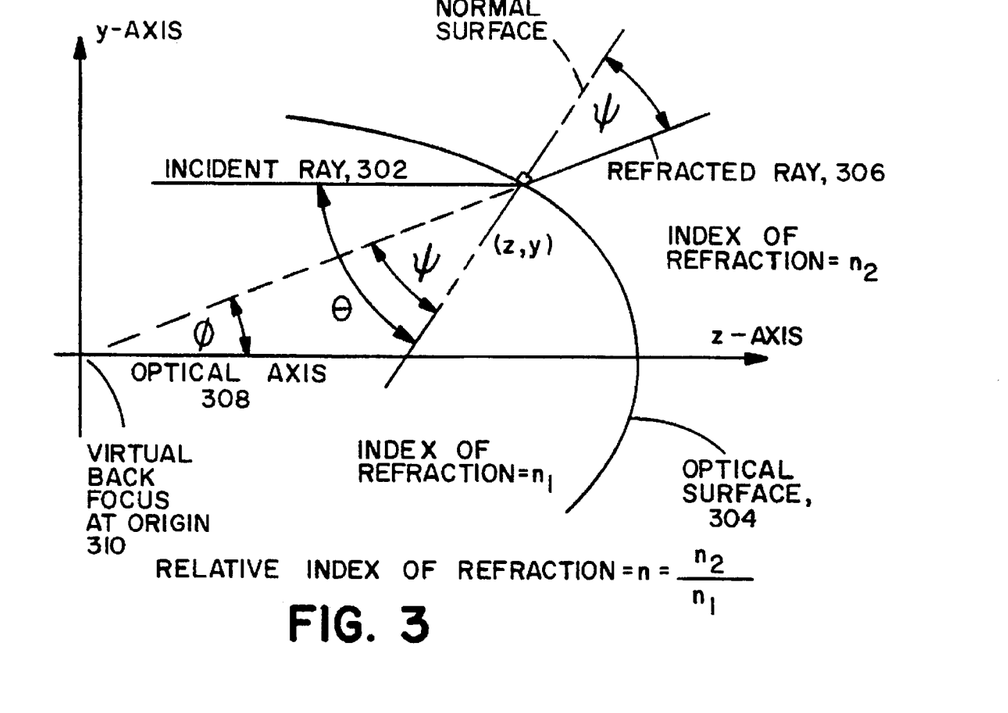
FIG. 3 is a pictorial definition of the parameters used in an analytical derivation of optical surface design equations, showing the optical surface on Y and Z axes.

FIG. 3 is a pictorial definition of the parameters used in the analytical derivation of the design equations for the optical surface of the present invention as graphed on a Z vs. Y axis. In FIG. 3, incident ray 302 which is parallel to the optic axis 308 hits an optical surface 304 at a point (Z,Y). The incident ray 302 is refracted at an angle psi to the normal of the optical surface 304. The resulting refracted ray 306 leaves the optical surface along a line that intersects the origin 310 which is the virtual back focus. The optical surface will exhibit no spherical aberration if and only if all such parallel rays 302 are refracted by the surface along lines 306 that intersect the origin. All such rays will thereby have a common virtual focal point at the origin.

The following is an analytical derivation of the design equations (that is, the optical prescription) presented above. The coordinate system follows a convention where the z-axis is the optic axis and the y-ordinate represents the radial distance from the optic axis, as shown in FIG. 3. Equations (6), (7), and (8) are derived from the geometry of FIG. 3 in which a concave optical surface is postulated that refracts parallel light rays so that all refracted rays have a common virtual back focus. Equation (9) is an expression of Snell's Law at the optical surface in which n represents the relative index of refraction or ratio of $n_2$ to $n_1$.

$$\theta = \phi + \psi \tag{6}$$

$$\tan\theta = -\frac{dz}{dy} \tag{7}$$

$$\tan\phi = y/z \tag{8}$$

$$\sin\theta = n \sin\psi \tag{9}$$

Substituting equation (6) into equation (9):

$$\sin\theta = n\sin(\theta - \phi) \tag{10}$$

$$\sin^2\theta = \frac{n^2\sin^2\phi}{1 + n^2 - 2n\cos\phi} \tag{11}$$

Substituting equation (11) into equation (7):

$$\frac{dy}{dz} = \pm \frac{[(1+n^2) - 2n\cos\phi - n^2\sin^2\phi]^{1/2}}{n\sin\phi} \tag{12}$$

Substituting equation (8) into equation (12) and selecting the negative root to satisfy the boundary conditions:

$$\frac{dy}{dz} = -\frac{n - \sqrt{1 + (y/z)^2}}{n(y/z)} \tag{13}$$

Letting w=y/z, this first-order differential equation can be separated and solved explicitly in w and z.

$$\frac{dy}{dz} = \frac{d}{dz}(wz) \tag{14}$$

-continued $$\frac{dy}{dz} = z\frac{dw}{dz} + w = -\frac{n - \sqrt{1+w^2}}{nw}$$

Separating the terms in w and z:

$$\left[ -\frac{1}{w + \frac{n - \sqrt{1+w^2}}{nw}} \right] dw = \frac{1}{z} dz \qquad (15)$$

Integrating:

$$\int \frac{nwdw}{n(1+w^2) - \sqrt{1+w^2}} = -\ln z + C_1 \qquad (16)$$

This integral can be evaluated by the method of successive substitutions or integration by parts.

$$\int \frac{nwdw}{n(1+w^2) - \sqrt{1+w^2}} = 1 + \ln(n\sqrt{1+w^2} - 1) \qquad (17)$$

Hence:

$$\ln(n\sqrt{1+w^2} - 1) = -\ln z + C_2 \qquad (18)$$

$$\ln[(n\sqrt{1+w^2} - 1)z] = C_2 \qquad (19)$$

Substituting the original variables for w into equation (19):

$$\ln[(n\sqrt{1+(y/z)^2} - 1)z] = C_2 \qquad (20)$$

$$n\sqrt{y^2 + z^2} - z = C_3 \qquad (21)$$

When y=0 (i.e., on-axis) z=F, therefore:

$$C_3 = n\sqrt{0^2 + F^2} - F = (n-1)F \qquad (22)$$

Substituting equation (22) into equation (21):

$$n\sqrt{y^2 + z^2} - z = (n-1)F \qquad (23)$$

Figure 4:
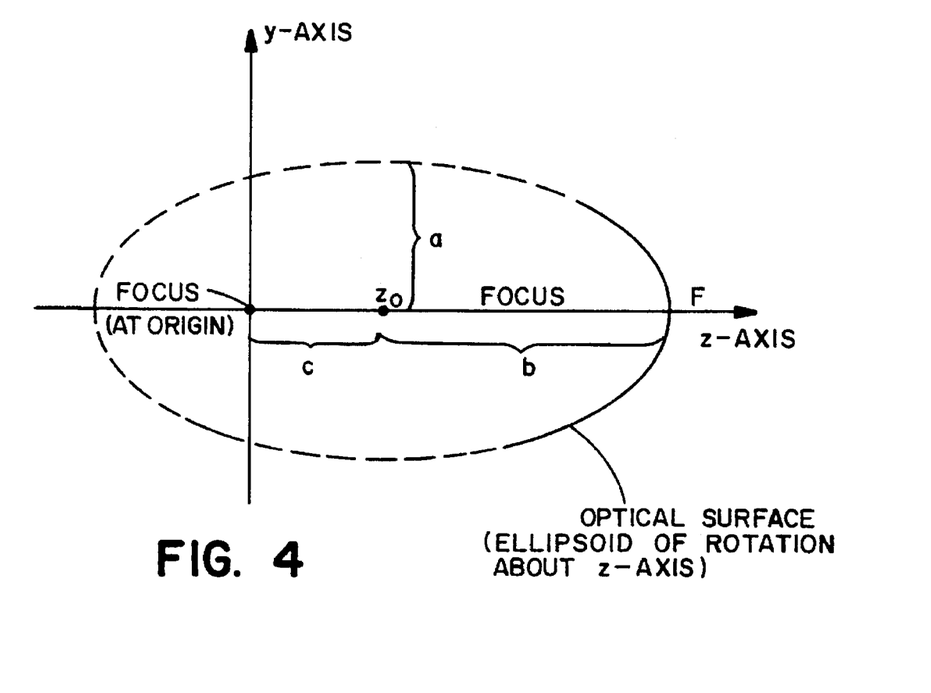
FIG. 4 is a pictorial description of the elliptical parameters describing the optical surface on Y and Z axes.

This is an equation of an ellipse with the semi-major axis along the optic axis (or z-axis), the left-most of the two foci at the origin, and the following elliptical parameters expressed in standard optical design nomenclature (see FIG. 4):

origin of ellipse: $Z_o = F/(n+1)$ (24)

semi-major axis: $b = [n/(n+1)] \cdot F$ (25)

semi-minor axis: $a = [(n-1)/(n+1)]^{1/2} \cdot F$ (26)

elliptical focus: $c = F/(n+1)$ (27)

eccentricity: $e = 1/n$ (28)

conic constant: $K = -e^2 = -1/n^2$ (29)

base radius of curvature: $R = (K+1)b = [(n-1)/n] \cdot F$ (30)

Design equations governing the construction of the beam expander can be derived from equations (24) through (30) by relating the back focal distances of the two surfaces to the magnification (M) and the thickness of the optic (th) as follows:

$F_2 = F_1 + th$ (31)

$M = F_2/F_1 = 1 + th/F_1$ (32)

$M = 1 + th \cdot [(n-1)/n] \cdot [1/R_1]$ (33)

$R_1 = [1/(M-1)] \cdot [(n-1)/n] \cdot th$ (34)

The base radius of the output optical surface is simply that of the input optical surface multiplied by the magnification.

$R_2 = R_1 \cdot M, \quad R_2 = R_1 \cdot (F2/F1).$ (35)

The gradient of the surface of the ellipsoids 204, 208 which governs the angle of refraction was given by equation (13) as a function only of the parameter (y/z), which is the tangent of the angle of refraction.

Note that the gradient is insensitive to a scaling parameter F; therefore, any ellipsoid surface satisfying the above conditions will have the same gradient at the point where it intercepts a particular refracted ray, and the ray will be perfectly recollimated by the second surface 208. Note that the input beam diameter ($D_1$) is limited by the length of the minor axis of the ellipsoid.

$$D_1 < 2\ [(n-1)/(n+1)]^{1/2} \cdot [th/(M-1)] \qquad (37)$$

C. FURTHER EMBODIMENTS OF THE REFRACTIVE OPTICAL BEAM EXPANDER

Figure 5:
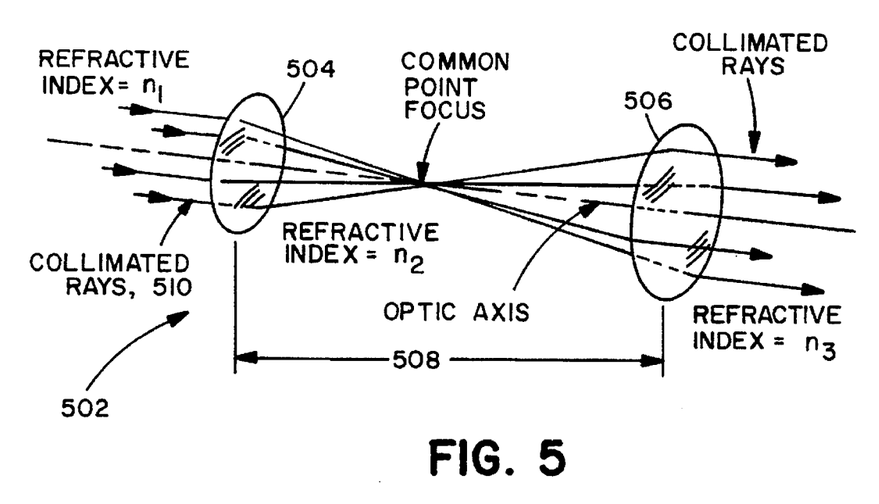
FIG. 5 is a perspective view of an immersion beam expander according to the present invention in a "focal" configuration.

FIG. 5 shows that a beam expander 502 is constructed by creating first and second ellipsoid surfaces 504, 506 on opposing faces of an optical medium, in which the ellipsoids 504, 506, are both convex, have the same eccentricity(or conic constant) and share a common rearmost focus point.

Parallel rays 510 entering the medium through the first ellipsoid 504 are refracted in such a way that all rays 512 within the medium 508 will share a common real focus that is coincident with the rear-most foci of the ellipsoids 504, 506.

In FIG. 5, the first and second optical surfaces 504, 506 are in a "focal" configuration since they share a common real focus point located between the two surfaces.

Figure 6:
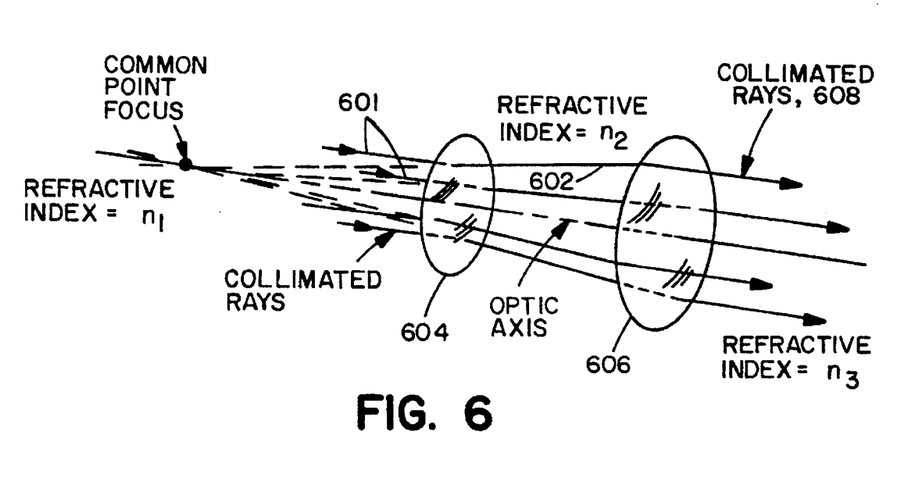
FIG. 6 is a perspective view of an immersion beam expander according to the present invention in an "afocal" configuration.

FIG. 6 shows two optical surfaces of a refractive beam expander according to the present invention in an "afocal" configuration. Refracted ray 602, provided in response to beams 601 incident upon a first optical surface 604, share a common focus point on the optic axis.

This point is not located between first and second optical surfaces 604, 606 but outside the medium. In accordance with the present invention, collimated rays 608 are expanded in comparison to rays 601.

Figure 7:
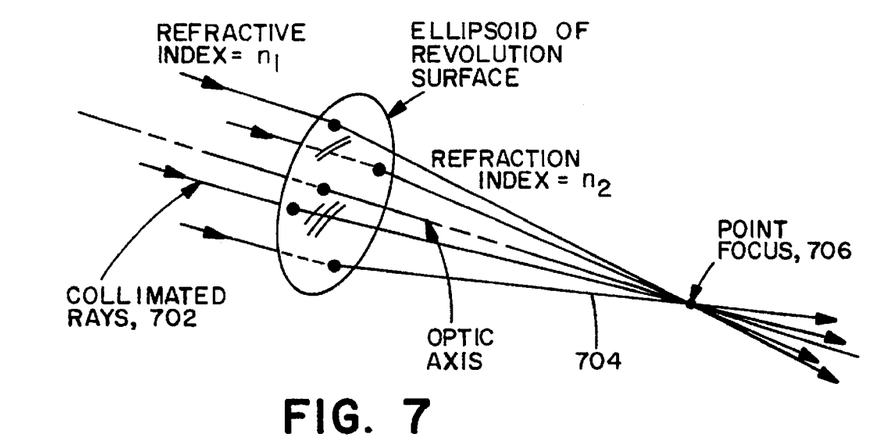
FIG. 7 is a perspective view of an alternative embodiment of the present invention wherein the optical surface of FIG. 2 is an ellipsoid of rotation that focusses light to a point.

FIG. 7 is a perspective view of another embodiment of an optical surface in accordance with the present invention. In FIG. 7 an ellipsoid of rotation is responsive to incident collimated rays 702 in a medium having a first refractive index $n_1$ for providing refracted rays 704 in a second medium of refractive index $n_2$ focused at a point 706.

Figure 8:
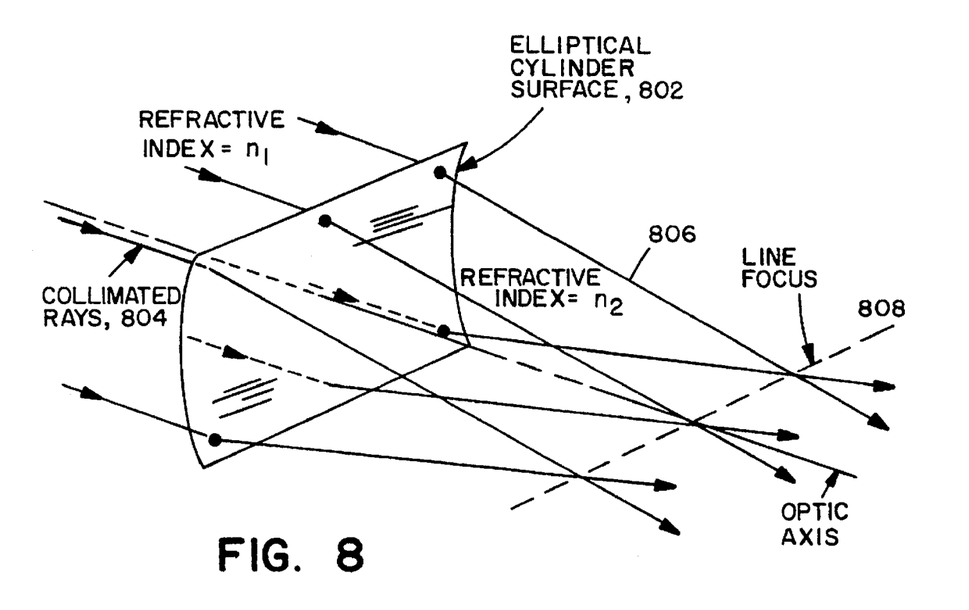
FIG. 8 is a perspective view of an alternative embodiment of the present invention wherein the optical surface of FIG. 2 is an elliptical cylinder which focuses light to a line.

FIG. 8 is a perspective view of another embodiment of an optical surface in accordance with the present invention. FIG. 8 shows an elliptical cylinder surface 802 responsive to incident collimated rays 804 for providing refracted rays 806 focused on a line 808.

The difference between FIG. 7 and FIG. 8, in result, is focusing to a point versus focusing to a line.

Figure 9:
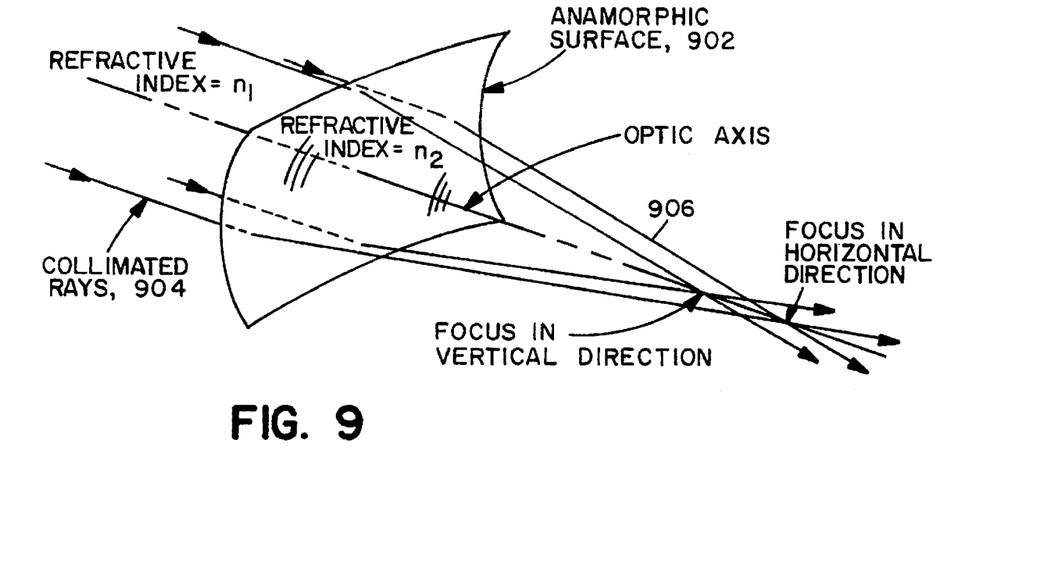
FIG. 9 is a perspective view of an alternative embodiment of the present invention wherein the optical surface of FIG. 2 is an anamorphic surface that focusses light astigmatically.

FIG. 9 is a perspective view of another embodiment of an optical surface in accordance with the present invention. FIG. 9 is a perspective of an anamorphic surface 902 responsive to incident collimated rays 904 providing refracted rays 906 focused at a different point for rays aligned horizontally than for rays aligned vertically, thereby focusing astigmatically.

Note that the ellipsoid of rotation surface shown in FIG. 7 is a special case of the anamorphic surface of FIG. 9 in which horizontally aligned and vertically aligned rays are focussed at the same point on the optic axis. Also, note that the elliptical cylinder surface as shown in FIG. 8 is a special case of the anamorphic surface of FIG. 9 in which the horizontally aligned rays are focussed at infinity.

D. FURTHER EMBODIMENTS OF THE REFRACTIVE LASER DIODE COLLIMATOR

Figure 10:
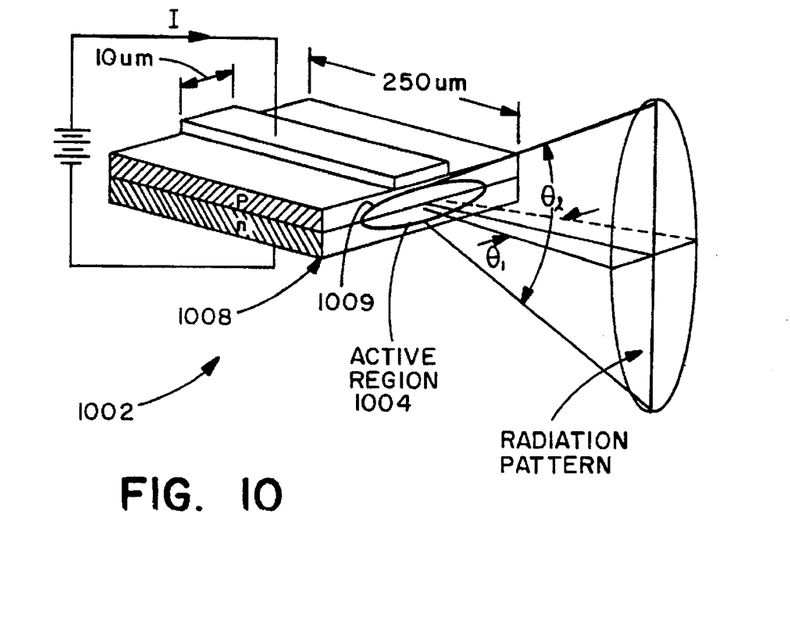
FIG. 10 is a is a perspective view of a laser diode light source of the type used with the present invention.

FIG. 10 is a perspective view of a generic p-n junction laser 1002. The active region is at the junction 1004 of p and n regions where a current I is flowing; the active region 1004 is shown as solid black. The emitting region inside the semiconductor 1008 is more or less an ellipsoid with a spatial extension which is different both perpendicular and parallel to the junction 1004. This results in a radiation pattern with different spreading angles. Whereas the light source shown is a p-n junction laser 1002, any source of light will suffice as a light source of the present invention.

Figure 11A:
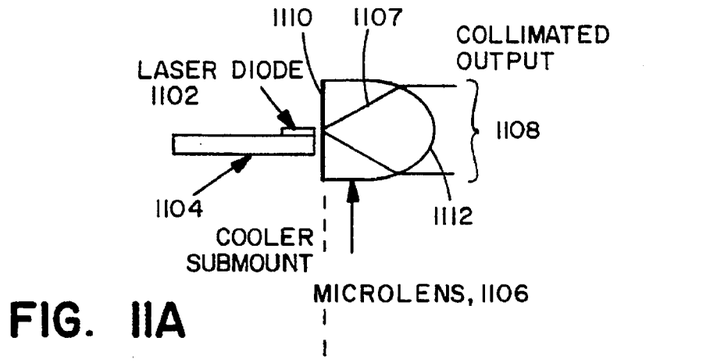
FIG. 11A is a side view of the laser diode of FIG. 10, providing light to a collimating lens according to the present invention.

FIG. 11A shows a laser diode 1102 sitting on top of cooler submount 1104 for directing light at a lens 1106. A laser beam emitted by the laser diode 1102 is incident upon the lens 1106 which produces an expanded, collimated beam 1108 in response to the incident light beam 1107. The lens 1108 has first and second optical surfaces, 1110, 1112.

In this embodiment, the first optical surface is flat and perpendicular to the incident laser beam. However, and as will be shown below, the first or second optical surfaces 1110, 1112 may take any one of three forms: a) an ellipsoid of rotation which focusses collimated light to a point, b) an elliptical cylinder which focusses collimated light to a line or c) a more complex anamorphic surface that focusses collimated light astigmatically.

Figure 11B:
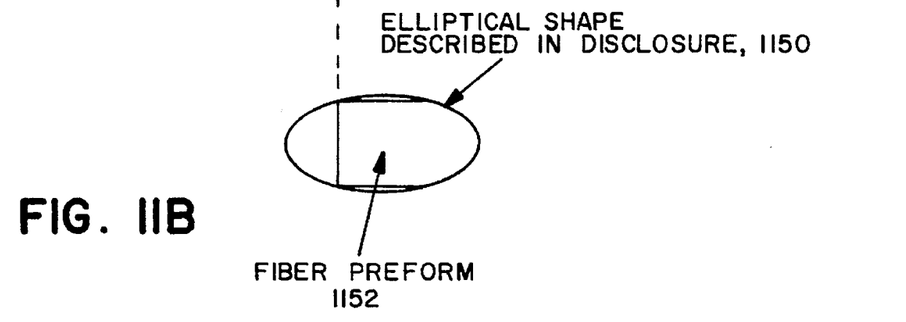
FIG. 11B is a cross-sectional view of a fiber preform from which may be drawn the lens of FIG. 11A.

FIG. 11B illustrates the elliptical shape of a fiber preform 1152 from which the lens 1106 of FIG. 11A is drawn. It is not necessary that the lens 1106 be drawn from fiber preform 1152. The drawing of a lens 1106 from (a) a fiber preform is well known, as is the manufacture of a lens by (b) traditional grinding and polishing, (c) diamond machining, by (d) lithographic definition with mass transport, or other conventional techniques.

Figure 12:
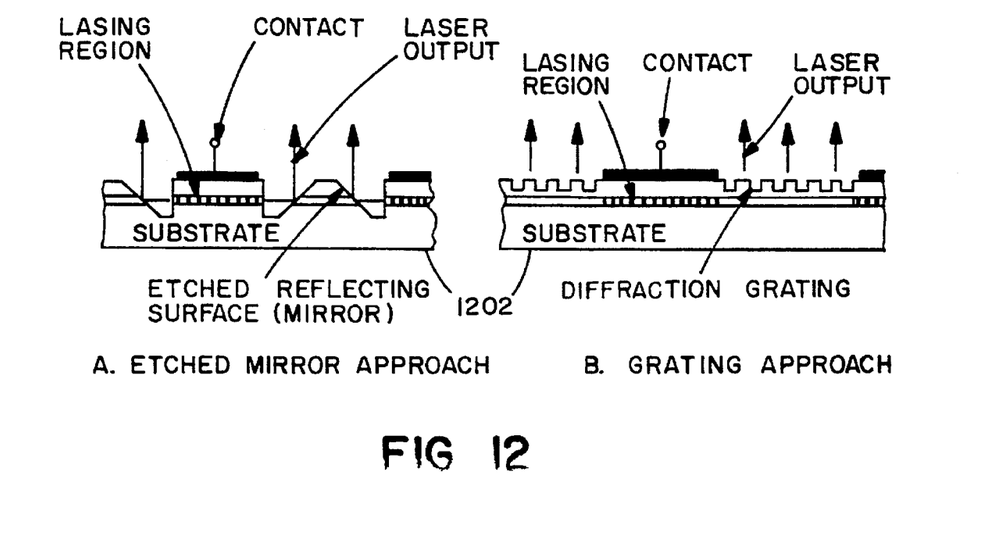
FIG. 12 is a side view of a surface-emitting diode.

The teachings of the present invention are applicable regardless of the nature of the light source. For example, the laser diode may have a beam edge-emitted from the active region of the edge of a p-n diode or light may come from a monolithic surface emitting laser diode. FIG. 12 shows an exemplary surface-emitting diode 1202. Surface-emitting diodes are well-known in the art (See "A Different Mirror", IEEE Spectrum August 1994, pp. 31–33). This surface emitting laser diode is fundamentally different from conventional configurations, as well as monolithic configurations, in that the light emerges directly from the surface of the planar semiconductor structure, not the edge. With these devices, it is not necessary to stack diode bars as in the case of the edge emitting diodes in order to obtain a two-dimensional output. The present invention, with the optical surfaces configured as individual lenslets in a two-dimensional lenslet array, may also improve the collimation of the surface-emitting devices over conventional optical designs.

Figure 13:
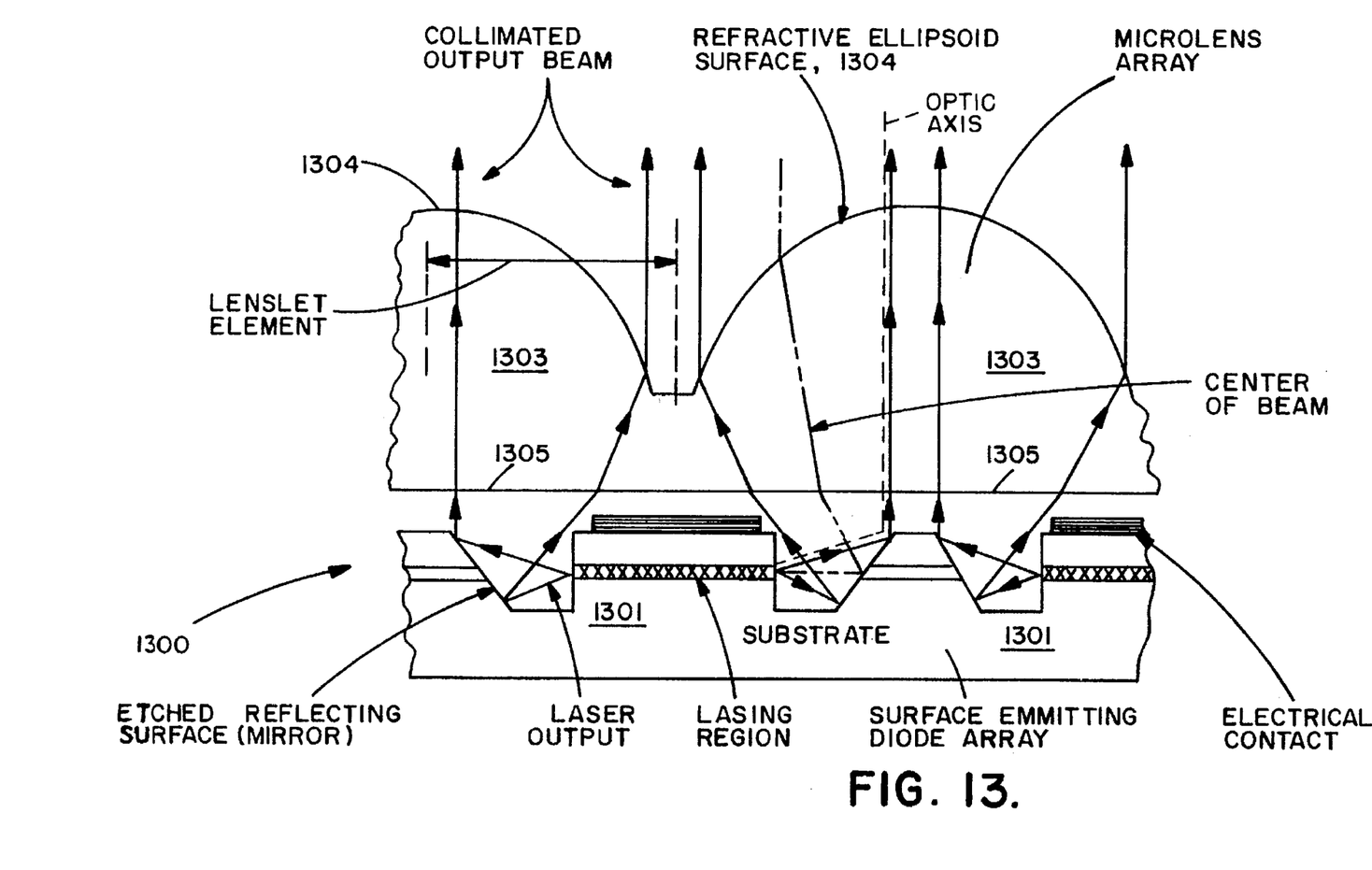
FIG. 13 is a side view of a surface-emitting diode with a collimating lens according to the present invention that is used off-aperture.

FIG. 13 is a side view of a one or two dimensional array 1300 of surface-emitting diodes 1301 employing an array of microlenses 1303 having a refractive ellipsoidal optical surface 1304 and a flat surface 1305 for receiving light from the diode 1301. Light is emitted from the lasing regions after which it hits etched reflecting surfaces and is provided as collimated output a beam from the microlens 1303.

E. BENEFITS OF THE INVENTION

The significance of the present invention derives from the fact that it is an exact optical form as is its reflective analog, the paraboloid; it is not the product of the successive design approximations using high order aspheric terms to achieve an acceptable optical prescription. Computer analysis using the Hughes Hexagon code was conducted on the refractive immersion beam expander in order to corroborate this analytical claim. The Hexagon analysis verified that for rays parallel to the optic axis, the resultant wavefronts of the expanded beam are in fact perfect (that is, zero optical pathlength differences across the aperture). Also, for paraxial rays corresponding to the angular spread of a practical laser beam, the wavefronts of the expanded beam are nearly perfect.

The Hexagon code was also used to determine the thermal and constructional sensitivities of a specific embodiment of the invention. The optical design used in the analysis is shown in FIG. 2, which is a 10.6 micrometer wavelength zinc selenide beam expanding optic with a 3.735× magnification, 6.8 millimeter input beam diameter, and 30 millimeter thickness measured at the optic axis. The conic constant and the radii of curvature of each surface were calculated from equations 2, 4 and 5 above. The results of the sensitivity analysis are presented in table 1 for this optic design. The column labelled parameter describes the design parameter that was perturbed from the ideal value. The column labelled change gives the magnitude and the sign of the perturbation. The remaining columns give the peak-to-valley optical pathlength difference, the RMS wavefront error, and the change in line-of-sight, respectively.

The first conclusion that may be drawn from these analyses is that the invention is of primary economic importance as a new "fundamental" optical form. Secondly, fabrication of these optics is feasible within the current state of the art. Finally, as new athermal infrared materials are developed and the state of the art in optical fabrication continues to advance, this invention may have significant practical value in replacing conventional multi-element optical assemblies with a single optical element that is insensitive to alignment. Also, as the surface quality of diamond turned optics improves, visible and near-infrared applications, such as helicopter wire detection and imaging laser radar, may become more affordable than with present optics technology. Furthermore, these optics can be produced using injection moulded plastic at very low cost, making consumer applications, such as automotive adaptive cruise control and collision warning, more affordable.

The present invention virtually eliminates the aberrations of conventional refractive optics due to the optical prescription of equations 1–5. In the prior art optical forms, the accuracy with which a lens or lens group focusses all of the light rays to a single point has been limited by the skill of the designer and the number of elements he can use to perform successive corrections. Inaccuracies in the optical design result in aberrations that limit the ability to focus light. An advantage of the present invention is that for reasonably monochromatic light, and operating reasonably on-axis (but not necessarily on-aperture), the optical surface will focus light with essentially no aberration. For light rays parallel to the optic axis, the aberration is precisely zero—which is shown mathematically in the disclosure and confirmed in the Hexagon simulation. Table 1 of the disclosure also examined the thermal and constructional sensitivities of a 3.735× magnification, zinc selenide beam expander in terms of the peak-to-valley optical pathlength differences, the RMS wavefront errors, and the line-of-sight variations.

In addition, an optical element in accordance with the teaching of the present invention will operate perfectly off-aperture. Also, an optical element in accordance with the present invention can be designed to operate nearly perfectly off-axis by keeping the distance between the incident rays and the optic axis small with respect to the optical focal length of the corresponding optical surface.

The present invention teaches an optical prescription for a refractive ellipsoidal optical surface between two optically transparent media of different refractive indices. Most refractive optical forms, including the present invention, use optics with surfaces that are conic surfaces of revolution or conic cylinders.

As should be well understood by those skilled in the art, various modifications may be made to the above and below equations, description and or drawings without departing from the spirit and scope of the present invention.

TABLE 1

CONSTRUCTIONAL AND THERMAL SENSITIVITY OF IMMERSION BEAM EXPANDER

| Parameter | Change | P-V OPD (@ 10.6 µm) | RMS Wavefront Error (@ 10.6 µm) | Line-of-Sight Variation (mrad) |
|---|---|---|---|---|
| Axial Thickness | +0.025 mm | 0.307λ Conv. | 0.088λ | N/A |
| Radius $R_1$ | −0.0254mm 0.40% | 0.522 Conv. | 0.150 | N/A |
| Radius $R_2$ | −0.254 mm 0.11% | 0.522 Diver. | 0.150 | N/A |
| Refractive Index | +0.0002 | 0.021 Conv. | 0.006 | N/A |
| Conic Constant $K_2$ | −0.002 | 0.020 Diver. | 0.006 | N/A |
| Conic Constant $K_1$ | −0.002 | 0.074 Conv. | 0.022 | N/A |
| Conic Constant Both $K_1$ and $K_2$ | −0.002 | 0.054 | 0.016 | N/A |
| Decenter Surface 1 WRT Surface 2 | 0.0254mm | 0.069 Astig. | 0.023 | 1.49 |
| Temperature * | +1.0°C. | 0.006 Conv. | 0.002 | N/A |

*Assumes: Δ / /°C. = 7.57E-6/°C. dn/dt = 6.05E-5/°C.
Note: Since refocus is not possible, only P-V OPD and RMS Wavefront defocusing for centered parameter changes are shown. No magnification change is listed as this is only germain in a pure afocal case

What is claimed is:

1. An immersion optical beam expander apparatus having no spherical aberration, comprising a first refractive ellipsoidal optical surface for causing collimated light originating in a first homogeneous optical medium, to be perfectly diverged from a virtual focus within said first homogeneous optical medium, further including a second refractive ellipsoidal optical surface separated from said first refractive ellipsoidal optical surface by an optical material and spaced from said first refractive ellipsoidal optical surface such that a real focus of said second refractive ellipsoidal optical surface is at a same location as said virtual focus, said first refractive ellipsoidal optical surface having a semi-major axis with a center located a distance $Z_o$ from said virtual focus, said first refractive ellipsoidal optical surface having a base radius of curvature (R1) which may be described in terms of a relative refractive index (n) and a virtual focal distance (F1), wherein: $Z_o=F1/(n+1)$ and $R1=(n-1)*F1/n$, said second refractive ellipsoidal optical surface having a real focus distance (F2) and a base radius of curvature (R2) which may be described in terms of equations $F2=(F1+(th))$ and $R2=R1*(F2/F1)$, respectively, wherein (th) represents a thickness of said optical material along an optic axis, wherein said relative refractive index (n) represents a ratio of a refractive index (n2) of said second homogeneous optical medium to a refractive index (n1) of said first homogeneous optical medium, and wherein each of said first and second refractive ellipsoidal optical surfaces has a respective conic constant (K), wherein $K=-1/n^2$.

2. The apparatus of claim 1, wherein an axis of said collimated light is displaced from an optic axis of said first refractive ellipsoidal optical surface.

3. The apparatus of claim 1, wherein an axis of said collimated light is lined up with an optic axis of said first refractive ellipsoidal optical surface.

4. The apparatus of claim 1, wherein said first and second refractive ellipsoidal optical surfaces are fabricated on the same optical material as an immersion optic.

5. The apparatus of claim 1, wherein at least one of said first and second refractive ellipsoidal optical surfaces is in the shape of an elliptical cylinder.

6. The apparatus of claim 1, wherein at least one of said first and second refractive ellipsoidal optical surfaces is in the shape of an ellipsoid of rotation.

7. The apparatus of claim 1, wherein said first or second refractive ellipsoidal optical surface is an anamorphic surface.

8. The apparatus of claim 1, wherein each of said first and second refractive ellipsoidal optical surfaces has an elliptical cylindrical configuration for collimating light to a line.

9. The apparatus of claim 1, wherein each of said first and second refractive ellipsoidal optical surfaces has an ellipsoid of rotation configuration for collimating light to a point.

10. The apparatus of claim 1, wherein each of said first and second refractive ellipsoidal optical surfaces has an anamorphic configuration for collimating light astigmatically.

11. A method for causing collimated light originating in a first homogeneous optical medium to be perfectly diverged from a virtual focus within said first homogeneous optical medium, wherein said collimated light is provided to a first refractive ellipsoidal optical surface of an immersion optical beam expander apparatus having no spherical aberration, wherein said immersion optical beam expander apparatus further includes a second refractive ellipsoidal optical surface separated from said first refractive ellipsoidal optical surface by an optical material and spaced from said first refractive ellipsoidal optical surface such that a real focus of said second refractive ellipsoidal optical surface is at a same location as said virtual focus, said first refractive ellipsoidal optical surface having a semi-major axis with a center located a distance $Z_o$ from said virtual focus, said first refractive ellipsoidal optical surface having a base radius of curvature (R1) which may be described in terms of a relative refractive index (n) and a virtual focal distance (F1), wherein: $Z_o=F1/(n+1)$ and $R1=(n-1)*F1/n$, said second refractive ellipsoidal optical surface having a real focus distance (F2) and a base radius of curvature (R2) which may be described in terms of equations $F2=(F1+(th))$ and $R2=R1*(F2/F1)$, respectively, wherein (th) represents a thickness of said optical material along an optic axis, wherein said relative refractive index (n) represents a ratio of a refractive index (n2) of said second homogeneous optical medium to a refractive index (n1) of said first homogeneous optical medium, and wherein each of said first and second refractive ellipsoidal optical surfaces has a respective conic constant (K), wherein $K=-1/n^2$.

12. The method of claim 11, wherein an axis of said collimated light is displaced from an optic axis of said first refractive ellipsoidal optical surface.

13. The method of claim 11, wherein an axis of said collimated light is lined up with an optic axis of said first refractive ellipsoidal optical surface.

14. The method of claim 11, wherein said first and second refractive ellipsoidal optical surfaces are fabricated on the same optical material as an immersion optic.

15. The method of claim 11, wherein said first or second refractive ellipsoidal optical surface is in the shape of an elliptical cylinder.

16. The method of claim 11, wherein said first or second refractive ellipsoidal optical surface is in the shape of an ellipsoid of rotation.

17. The method of claim 11, wherein said first or second refractive ellipsoidal optical surface is an anamorphic surface.

18. The method of claim 11, wherein both of said first and second refractive ellipsoidal optical surfaces have an elliptical cylindrical configuration for collimating light to a line.

19. The method of claim 11, wherein both of said first and second refractive ellipsoidal optical surfaces have an ellipsoid of rotation configuration for collimating light to a point.

20. The method of claim 11, wherein both of said first and second refractive ellipsoidal optical surfaces have an anamorphic configuration for collimating light astigmatically.

* * * * *